United States Patent
Alexander

(10) Patent No.: US 9,397,784 B2
(45) Date of Patent: Jul. 19, 2016

(54) SPLIT RADIO ARCHITECTURE

(71) Applicant: Cohda Wireless Pty Ltd., North Adelaide (AU)

(72) Inventor: Paul Dean Alexander, North Adelaide (AU)

(73) Assignee: Cohda Wireless Pty Ltd. (AU)

( * ) Notice: Subject to any disclaimer, the term of this patent is extended or adjusted under 35 U.S.C. 154(b) by 0 days.

(21) Appl. No.: 14/427,919

(22) PCT Filed: Sep. 12, 2013

(86) PCT No.: PCT/AU2013/001040
§ 371 (c)(1),
(2) Date: Mar. 12, 2015

(87) PCT Pub. No.: WO2014/040130
PCT Pub. Date: Mar. 20, 2014

(65) Prior Publication Data
US 2015/0244499 A1    Aug. 27, 2015

(30) Foreign Application Priority Data
Sep. 12, 2012    (AU) ................. 2012903985

(51) Int. Cl.
*H04L 1/00* (2006.01)
*H01Q 23/00* (2006.01)
(Continued)

(52) U.S. Cl.
CPC ............. *H04L 1/0054* (2013.01); *H01Q 1/32* (2013.01); *H01Q 21/28* (2013.01); *H01Q 23/00* (2013.01); *H03M 13/31* (2013.01); *H03M 13/41* (2013.01);
(Continued)

(58) Field of Classification Search
CPC .... H04B 1/126; H04B 7/0845; H04B 1/7115; H04B 7/0817; H04L 1/02; H04L 25/03006; H04L 1/005; H04L 1/0057; H04L 1/06; H04L 1/0054; H04L 1/006
USPC .......................................... 375/341, 347–350
See application file for complete search history.

(56) References Cited

U.S. PATENT DOCUMENTS 6,940,827 B2 * 9/2005 Li ....................... H04B 1/707 370/278
7,512,198 B2 * 3/2009 Strodtbeck ............... H04L 1/06 370/465

(Continued)

FOREIGN PATENT DOCUMENTS

WO    WO-2014/040130    3/2014

OTHER PUBLICATIONS

"International Application No. PCT/AU2013/001040, International Preliminary Report on Patentability mailed Dec. 23, 2014", 6 pgs.
(Continued)

*Primary Examiner* — Emmanuel Bayard
(74) *Attorney, Agent, or Firm* — Schwegman, Lundberg & Woessner, P.A.

(57) ABSTRACT

The present invention relates to a split signal processing system comprising: multiple antennas for receiving transmitted signals carrying an information-bearing symbol; multiple signal processing modules associated with the respective antennas and being configured to generate respective bit log-likelihood ratio (LLR) sequences, each corresponding to the information-bearing symbol; and a LLR combiner for combining the bit LLR sequences received from the multiple signal processing modules.

20 Claims, 5 Drawing Sheets

(51) Int. Cl.
    *H03M 13/31*         (2006.01)
    *H03M 13/41*         (2006.01)
    *H01Q 1/32*          (2006.01)
    *H01Q 21/28*         (2006.01)
    *H03M 13/23*         (2006.01)
    *H03M 13/27*         (2006.01)
    *H03M 13/00*         (2006.01)
    *H04B 7/08*          (2006.01)

(52) U.S. Cl.
    CPC ............ *H03M 13/4169* (2013.01); *H04B 7/08* (2013.01); *H03M 13/23* (2013.01); *H03M 13/2707* (2013.01); *H03M 13/6362* (2013.01); *H04B 7/0885* (2013.01)

(56) References Cited

U.S. PATENT DOCUMENTS

| | | | | |
|---|---|---|---|---|
| 7,609,777 B2 * | 10/2009 | Garrett | H04L 1/0618 | 375/262 |
| 7,706,486 B2 * | 4/2010 | Strodtbeck | H04L 25/067 | 370/465 |
| 8,270,541 B2 * | 9/2012 | Fischer et al. | | 375/341 |
| 8,279,836 B2 * | 10/2012 | Ma et al. | | 370/331 |
| 8,279,966 B2 * | 10/2012 | Lee et al. | | 375/267 |
| 8,340,534 B2 * | 12/2012 | Zhang | H04J 14/002 | 398/202 |
| 8,345,562 B2 * | 1/2013 | Hoshino et al. | | 370/252 |
| 8,467,477 B2 * | 6/2013 | Tseng et al. | | 375/316 |
| 8,576,955 B2 * | 11/2013 | Challa et al. | | 375/340 |
| 8,693,588 B2 * | 4/2014 | McCloud et al. | | 375/341 |
| 8,699,601 B1 * | 4/2014 | Lee et al. | | 375/267 |
| 8,731,114 B2 * | 5/2014 | Bae et al. | | 375/341 |
| 8,750,418 B2 * | 6/2014 | Lee et al. | | 375/299 |
| 8,787,486 B2 * | 7/2014 | Lee et al. | | 375/267 |
| 8,867,600 B2 * | 10/2014 | Oren et al. | | 375/232 |
| 8,903,025 B1 * | 12/2014 | Chandrasekar et al. | | 375/340 |
| 8,929,472 B1 * | 1/2015 | Lee et al. | | 375/267 |
| 9,059,761 B2 * | 6/2015 | Seo | H04B 7/0617 | |
| 9,083,499 B1 * | 7/2015 | Tong | H04L 1/0048 | |
| 9,094,179 B2 * | 7/2015 | Kim | H04L 1/007 | |
| 2005/0107057 A1 * | 5/2005 | Sun | H04B 7/0845 | 455/272 |
| 2005/0276344 A1 * | 12/2005 | Ling et al. | | 375/260 |
| 2006/0067278 A1 * | 3/2006 | Li | H04B 1/707 | 370/335 |
| 2006/0068831 A1 * | 3/2006 | Stewart | H04W 52/40 | 455/522 |
| 2006/0133533 A1 * | 6/2006 | Khandekar et al. | | 375/279 |
| 2007/0071150 A1 * | 3/2007 | Yang | H04B 7/0817 | 375/347 |
| 2007/0098122 A1 * | 5/2007 | Tseng | H04L 1/0054 | 375/347 |
| 2008/0019331 A1 | 1/2008 | Thomas et al. | | |
| 2008/0072115 A1 * | 3/2008 | Cho et al. | | 714/751 |
| 2009/0154608 A1 | 6/2009 | Yoon et al. | | |
| 2009/0316840 A1 * | 12/2009 | Park et al. | | 375/341 |
| 2010/0074350 A1 * | 3/2010 | Malladi et al. | | 375/260 |
| 2010/0232535 A1 * | 9/2010 | Yue et al. | | 375/267 |
| 2010/0311343 A1 * | 12/2010 | Keerthi | H04L 5/0023 | 455/63.1 |
| 2014/0254719 A1 * | 9/2014 | Lee et al. | | 375/296 |

OTHER PUBLICATIONS

"International Application No. PCT/AU2013/001040, International Search Report and Written Opinion mailed Oct. 8, 2013", 10 pgs.

* cited by examiner

SPLIT RADIO ARCHITECTURE

PRIORITY CLAIM TO RELATED APPLICATIONS

This application is a U.S. national stage application filed under 35 U.S.C. §371 from International Application Serial No. PCT/AU2013/001040, which was filed Sep. 12, 2013, and published as WO 2014/040130 on Mar. 20, 2014, and which claims priority to Australia Application No. 2012903985, filed Sep. 12, 2012, which applications and publication are incorporated by reference as if reproduced herein and made a part hereof in their entirety, and the benefit of priority of each of which is claimed herein.

FIELD OF THE INVENTION

The present application relates to wireless communications systems using multiple antennas. In particular applications the invention relates to Car-2-X systems using more than one antenna.

BACKGROUND OF THE INVENTION

The use of multiple antennas in wireless communications systems is well known to provide significant performance advantages. In particular, links can be made much more robust to multipath fading. This is particularly the case in the emerging 5.9 GHz Car to Car and Car to Infrastructure communications. These are jointly referred to as Car-2-X.

In automotive applications it is desirable to reduce the cost of systems to be deployed to vehicles. Multiple antenna arrangements require extra hardware over single antenna systems. Vehicle manufacturers may want to space antenna elements apart by a meter or more. For example a pair of antennas may be deployed at the rear and at the front of the vehicle roof, or on either side of the vehicle in the mirrors.

Optimal diversity performance is obtained when signals from each antenna are processed using independent RF front-tend and digital baseband processing up until the point of demodulation, as illustrated in FIG. 1. Each antenna (101A and 101B) would have its own RF module (102A and 102B) for frequency down-conversion, front end module (FEM) (104A and 104B) for packet acquisition, Automatic Gain Control, synchronisation and channel estimation. The information output from the FEM (104A and 104B) may be partially demodulated by a partial demodulator (106A and 106B). The demodulator 111 combines the signals from all antennas (e.g. 1, 2 or more) using the channel estimate and the observed signal. The channel estimate includes a complex signal level and noise power. The demodulator 111 may then provide its output to a forward error correction (FEC) decoder 112 for providing a decoded output.

In OFDM systems (such as IEEE 802.11p and ETSI TC-ITS G5) this processing is done in the frequency domain (after the application of an FFT) with each OFDM symbol being processed by an FFT resulting in N data bearing symbols per FFT application. In IEEE 802.11p there are 48 data bearing symbols output for each FFT. Phase Shift Keying (PSK) and Quadature Amplitude Modulation (QAM) are typical modulation formats applied to the signals. At the receiver the demodulator's task is to map received symbols corresponding to transmitted symbols to set of bit log-likelihood-ratios (LLR) for each bit used to construct the symbol. For example in 64-QAM there are six bits used to identify a constellation point. Sequences of these LLRs are processed by Forward Error Correction (FEC) decoders to create estimates of the transmitted information bit sequence.

The OFDM multiple antenna receiver is illustrated in FIG. 2. Transmitter details are not shown, and neither is Block Deinterleaver and Interleaver detail shown in the FEC Decoder 212. The FEC decoder 212 will update one OFDM symbol at a time as the bits for each OFDM symbol are normally interleaved in a Block interleaver at the transmitter. This interleaving is undone at the receiver by deinterleaving the LLRs.

The detail of the prior art demodulation for OFDM modulated signals such as IEEE 802.11p is shown in FIG. 2, which shows an example with two antennas.

Each antenna (201A and 201B) configured to receive a signal transmitted across a channel may provide the received signal to a respective RF module (202A and 202B) for frequency down-conversion. The frequency down-converted signal may be provided to a respective receiver digital front end module (FEM) (204A and 204B). Each FEM (204A and 204B) associated with a respective antenna performs functions such as analogue to digital conversion (ADC), filtering, Automatic Gain control and synchronisation (time and frequency). The resulting time domain signal is fed one OFDM symbol at a time to the respective FFT module (206A and 206B).

The FFT module (206A and 206B) transforms the time domain signal to the frequency domain resulting in a block of modulated symbols (often referred to as subcarriers). These symbols are each impaired in transmission by fading and noise. The nature of this fading and noise changes during the packet in Car-2-X use.

Channel estimation of the channel impairing each of these subcarriers is performed by channel estimate modules 208A and 208B. The outputs of the FFTs 206A and 206B and the outputs of the channel estimators 208A and 208B are fed to LLR block 210. Complex channel magnitudes and noise power are estimated for each antenna independently. These estimates are used in the LLR block 210 to calculate the bit log-likelihood ratios (LLRs) for each bit constituting each sub-carrier symbol. The resulting sequence of bit LLRs is fed to the FEC Decoder module 212. The FEC Decoder module 212 may also include an internal block interleaver if the transmitter interleaved encoder outputs. This interleaver would be applied prior to processing the Forward Error Correction.

Diversity is optimally exploited when the baseband signals from two or more antennas are employed in the demodulation process. This joint demodulation is then passed to a single Viterbi decoder and the information bearing bits released to upper layers of the communication protocol (for subsequent processing such as descrambling, CRC checking etc).

Problems occur when two or more antennas are required and they are to be separated by advantageously large distances (e.g. a meter or more). Larger distances offer better spatial diversity and more flexible installation for the Vehicle Manufacturers. However they present problems for the receiver system designer. The two or more antenna elements are to be separated but their signals must merge for Joint Demodulation and processing by a single FEC Decoder. This implies that there is a long connection in at least one of the paths:

1/Antenna to RF: Long RF cables between Antenna and RF module (Coaxial cables are expensive and are also bad for transmit power);
 2/Baseband digital samples: Long very high speed digital link (High speed digital links require expensive cables to avoid interference).

Reference to any prior art in the specification is not, and should not be taken as, an acknowledgment or any form of suggestion that this prior art forms part of the common general knowledge in any jurisdiction or that this prior art could reasonably be expected to be understood, regarded as relevant and/or combined with other pieces of prior art by a person skilled in the art.

SUMMARY OF THE INVENTION

In broad terms the invention relates to a split signal processing system comprising a plurality of antennas for receiving transmitted signals. The antennas are associated with, respective signal processing modules. Data from multiple signal processing modules is combined and the combined data is used in the joint demodulation of signals received by multiple antennas. The data that is combined may be bit log-likelihood ratios (LLRs).

According to one aspect of the invention, there is provided a split signal processing system comprising multiple antennas for receiving transmitted signals carrying an information-bearing symbol, multiple signal processing modules associated with the respective antennas and being configured to generate respective bit log-likelihood ratio (LLR) sequences, each corresponding to the information-bearing symbol, and a LLR combiner for combining the bit LLR sequences received from the multiple signal processing modules.

In one embodiment, the multiple signal processing modules include a master signal processing module and one or more associated slave signal processing modules. The master module may comprise an FEC decoder for decoding the combined bit LLR sequences to determine an information sequence. The FEC decoder may be configured to generate dual outputs, which may be information bits and coded bits.

The one or more associated slave modules may include any one or more of the following features:
  configured to send the respective bit LLR sequences to the master module asynchronously;
  configured with high priority access to the respective links between the master module and the one or more associated slave modules for sending bit LLR sequences; and
  configured to receive training symbol identifiers from the master module upon availability of the respective links.

Each signal processing module may comprise a channel estimator. The channel estimator in a slave module may be configured to produce synchronous channel estimates while training symbols are available asynchronously.

The LLR combiner may include a de-interleaver.

The transmitted signals may include signals transmitted across multiple channels.

The multiple processing modules are configured as peer modules each associated with a respective channel. The peer modules may each include multiplexers and demultiplexers for serial processing of the multiple channels. The peer modules may each include multiple processing streams for parallel processing of the multiple channels. Alternatively the peer modules may each include multiple processing streams for parallel processing of the multiple channels.

The multiple antennas may be mounted on a vehicle. The multiple antennas may be spaced apart from one another on the vehicle.

The signal processing modules may be located near their respective associated antennas.

According to another aspect of the invention, there is provided a signal processing module for use in a split signal processing system including multiple antennas for receiving transmitted signals carrying an information-bearing symbol, the signal processing module being associated with one of the multiple antennas and comprising:
  a data generator for generating a first bit log-likelihood ratio (LLR) sequence corresponding to the information-bearing symbol; and
  a LLR combiner for combining the first bit LLR sequence with one or more second bit LLR sequences corresponding to the information-bearing symbol.

The signal processing module may be configured as a master module associated with one or more slave modules.

The transmitted signals may include signals transmitted across multiple channels and the signal processing module modules may further comprise multiplexers and demultiplexers for serial processing of the multiple channels. Alternatively the transmitted signals may include signals transmitted across multiple channels and the signal processing module modules may further comprise multiple processing streams for parallel processing of the multiple channels.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

DETAILED DESCRIPTION OF THE EMBODIMENTS

Bit LLR Exchange

In order to advantageously locate the RF processing nearby to the antenna in a system with two or more antennas, a split radio architecture transports bit LLRs between the modules associated with the respective antennas.

This is advantageous because the information rates for bit LLRs are the lowest of all points in the receiver chain prior to joint demodulation. The only lower bit rate is the information bit sequence estimate out of the FEC Decoder. However, exchanging information bit sequence estimates is not regarded as optimal in terms of spatial diversity gain.

Figure 1:
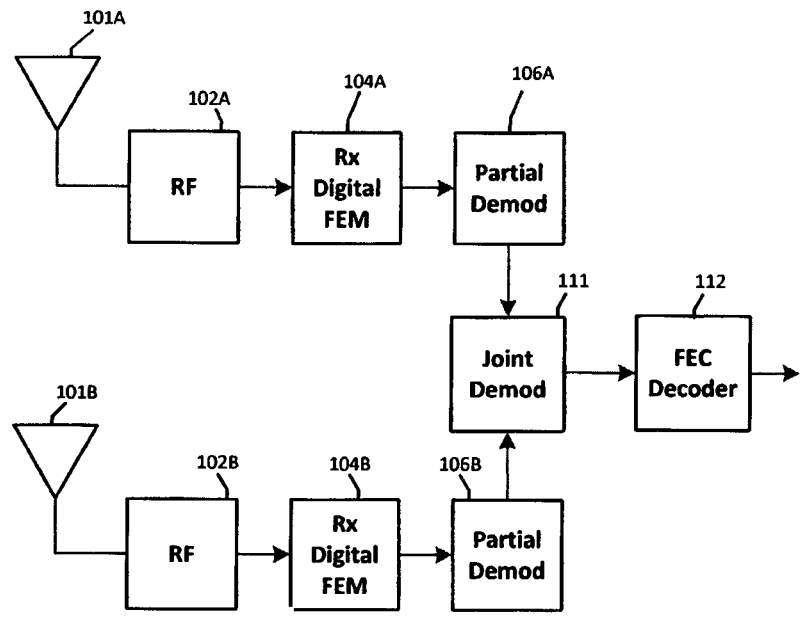
FIG. 1 is a schematic diagram of a prior art receiver arrangement having two antennas.
Figure 2:
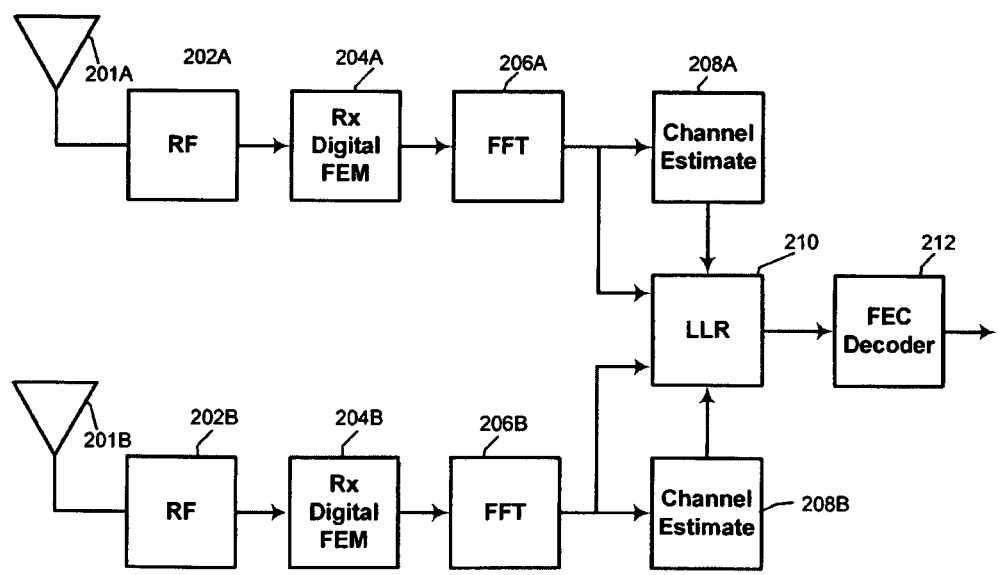
FIG. 2 is a schematic diagram of a prior art OFDM receiver arrangement having two antennas.
Figure 4:
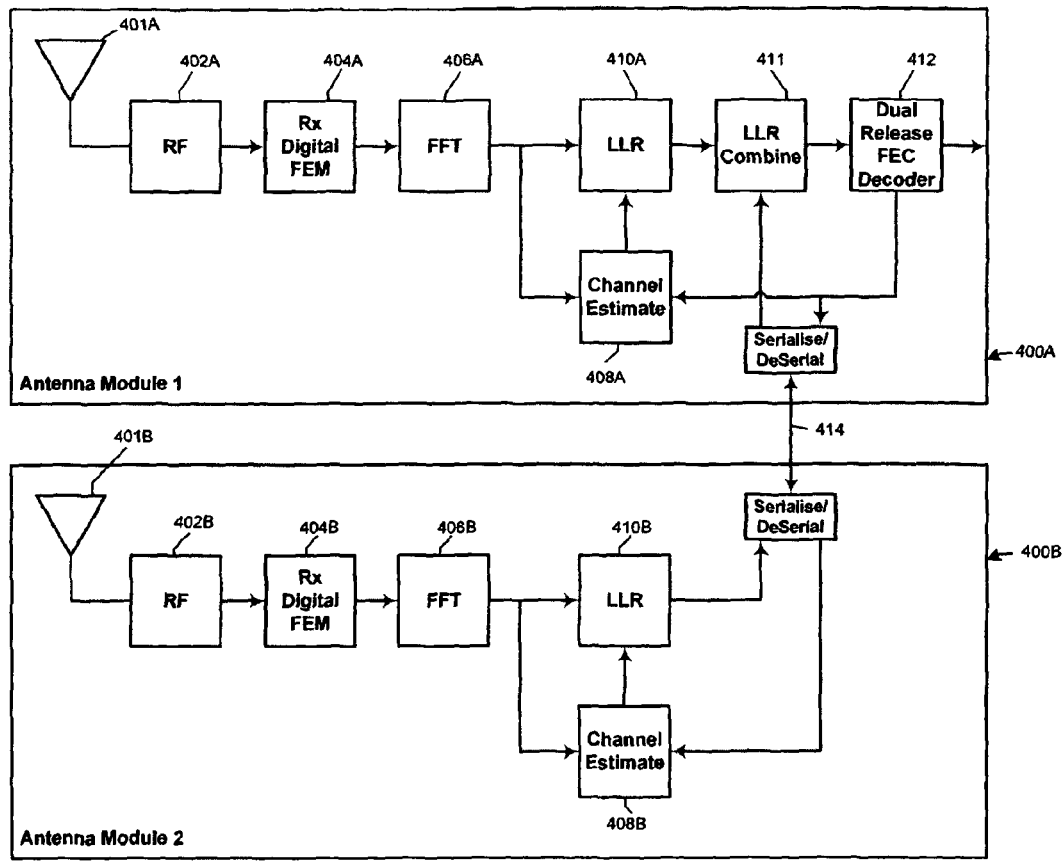
FIG. 4 is a schematic diagram of a split architecture in which data is exchanged between two antenna modules in a master/slave configuration.

In the case of IEEE 802.11p standard with 10 MHz channel spacing (52 subcarriers including 4 pilot subcarriers and 48 data bearing sub-carriers), 3 options of joint demodulation are:

1. Referring to FIG. 1, the Rx Digital Front End Modules (FEM) (104A and 104B) will output I/Q samples at about 10×2×16 Mbps=320 Mbps;
2. Referring to FIG. 2, the FFT modules (206A and 206B) will output at about 52×2×16 Bits per 8 μs=208 Mbps; and
3. Referring to FIG. 4, assuming 4 bits to represent a single Bit LLR (in practice sometimes 3 bits are used) then the LLR modules (410A and 410B) will output 48×6×4 Bits per 8 μs=144 Mbps.

This example analysis assumes the highest IEEE 802.11p data rate in 10 MHz of 27 Mbps. It is expected that the majority of communications in Car-2-X applications will occur using data rates of 6 or 12 Mbps in which case the LLR modules 410A and 410B in option 3 will produce 48 and 96 Mbps. The other two options analysed do not scale their rate requirement with over-the-air data rate.

Due to the less stringent requirements for lower data rate transmission, it is therefore advantageous to transport bit LLRs for example between the antenna location and the location of the central FEC processing.

Training Symbols

In Car-2-X use, it is preferred to implement a form of channel tracking during the reception of a packet. This can be done by using FEC decoder outcomes to assist the channel estimate module. The split radio architecture described herein uses a dual release FEC decoder which, in addition to releasing a stream of bits corresponding to the information-bearing bits at the transmitter, also releases an estimate of the coded bits. The coded bits are the bits that appear at the output of the encoder at the transmitter. The information-bearing bits are fed into the input of the encoder at the transmitter. In trellis representations of convolutional codes the coded bits are the output bits on branch labels. The information bearing bits are input bits on the branch labels.

Figure 3:
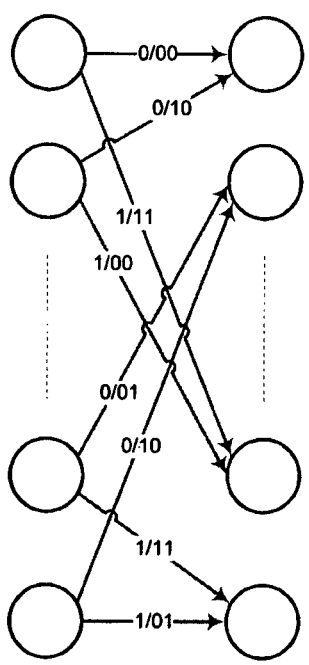
FIG. 3 is an example of an FEC trellis representation showing branch labels.

An example of a rate ½ convolutional code trellis is shown in FIG. 3. Each transition from one state of the encoder to the next is labelled in the form $m/C_1C_2$ with an input bit m and corresponding output bit pair $C_1C_2$.

The coded bit estimates from the dual release FEC decoder can be used to generate training symbols for channel estimation. Training symbols are constructed by puncturing, interleaving and mapping to I/Q constellation in mirroring the transmitter function. Training symbols are applied to corresponding subcarriers of the FFT output to recover a channel estimate for the OFDM symbol. Training symbols are communicated across the link using the signal after interleaving.

In one arrangement the dual release FEC decoder is based on a Viterbi decoder. The dual release FEC decoder has an integrated block deinterleaver at its input. Additionally it has a block interleaver on the coded bits output replicating the transmitter interleaving of coded bits. Viterbi decoders normally release information bits by tracing back through a survivor memory. Therefore the information bits are often released in reverse order. This release is normally block based so each block must be reversed in order before final release to upper layers.

The Viterbi-decoder trace-back process can be altered to also release the bits corresponding to the coded bits (i.e. the output bits $C_1C_2$ on the branch labels of FIG. 3). These bits will also be presented in reverse order. However as they are required to be interleaved for use in the channel estimator it is advantageous to restructure the interleaver to accommodate the order in which these coded bits are delivered by the modified Viterbi decoder traceback.

Another advantage of the described arrangement is that there is no need for a re-encode step. In a re-encode step, an estimate of the coded bit sequence could be obtained by feeding information bearing bits released by the Viterbi decoder back through an encoder identical to that at the transmitter. This re-encoding requires extra processing steps which are advantageously avoided in the present arrangement.

The bit rate requirement to transport the training data output from the Dual Release FEC decoder is dependent on the data rate and the OFDM symbol period.

For 10 MHz channel spacing OFDM symbols occur every 8 The highest data rate uses 64-QAM in IEEE 802.11p which is 6 bits per subcarrier. In IEEE 802.11p there are 48 data bearing subcarriers and 4 pilot subcarriers totaling 52. Therefore the data rate required is 6*48 bits per 8 μs=36 Mbps to transport indices of frequency-domain training symbols.

Note that puncturing of the FEC encoder output may be present at the transmitter. This is easily accommodated as part of the interleaver and deinterleaver implementation at the receiver.

The total data rate required on the digital link between the modules for LLR and training symbol index exchange is shown in Table 1. Analysis is carried out for 10 and 20 MHz channel spacing for the case where two radios are implemented.

TABLE 1

Link data rate requirements

| 2 Antennas | 1 Radio | | 2 Radios | |
| --- | --- | --- | --- | --- |
| | Bits per OFDM Symbol | M Bits per Second | Bits per OFDM Symbol | M Bits per Second |
| 10 MHz | 1176 | 147 | 2353 | 294 |
| 20 MHz | 1176 | 294 | 2353 | 588 |

An embodiment of the split radio architecture, for an example with two antennas 401A and 401B each configured for receiving transmitted signals carrying an information-bearing symbol, is shown in FIG. 4. The received signal is processed in downstream components which collectively may be referred to as a signal processing module. Each signal processing module may be located close to the antenna (401A and 401B) resulting in low loss for received operation and good transmit power performance. The signal processing module and the antenna together are hereinafter referred to as an antenna module.

In this embodiment, each antenna module (400A and 400B) includes an antenna (401A and 401B), a RF module (402A and 402B), a FEM (404A and 404B) and a FFT module (406A and 406B). Similar to the system shown in FIG. 2, each RF module (402A and 402B) frequency-down-converts the signal received by the corresponding antenna (401A and 401B) for subsequent provision to the respective FEM (404A and 404B). Although not shown, the RF module may include transmit functionality. Each FEM may perform functions such as analogue to digital conversion (ADC), filtering, Automatic Gain control and synchronisation (time and frequency). The output of each FEM (404A and 404B) is then provided to the respective FFT module (406A and 406B) for transforming a time domain signal into the frequency domain. In this embodiment, each antenna module (400A and 400B) includes its respective LLR module (410A and 410B) for generating a respective sequence of bit LLRs based on the frequency domain signal provided by the corresponding FFT module. Each generated sequence of bit LLRs corresponds to the information-bearing symbol carried in the transmitted signal. In this embodiment, antenna module 400A includes LLR combine module 411 for combining the bit LLR sequences generated in the two antenna modules to provide a combined bit LLR sequence to FEC decoder 412. In this embodiment, the FEC decoder 412 is included in antenna module 400A.

The antenna module 400A having the FEC decoder 412 may be referred to as the master and other modules (e.g. 400B) contributing bit LLRs for their respective antennas may be referred to as slave.

Antenna modules 400A and 400B may each include a channel estimate module (408A and 408B) for providing a channel estimate to the respective LLR module (410A and 410B) based on outputs from the respective FFT module (406A and 406B) and/or feedback from the FEC decoder 412. The system illustrated in FIG. 4 has the benefits of feeding training symbol indexes from the FEC decoder 412 back to the channel estimate module or modules (408A and 408B) for training purposes. For one module (i.e. the master) this feedback is internal. For the other (i.e. the slave) it is fed across a digital link 414. We have shown a serial link here for example. In this example LLRs flow from antenna module 400B to antenna module 400A and training symbol indexes flow in the opposite direction from antenna module 400A to antenna module 400B.

The bit error rate in a Viterbi traceback decreases with increasing traceback length. The age of the information bits released and the coded bits released may be different. A single traceback operation can release coded bits for training earlier in the traceback than the information bits. While errors are not tolerated in the information bit sequence release, it is possible to release coded bits with an elevated chance of error. This earlier release allows the channel estimate module (408A and 408B) to have relatively newer training symbols, albeit with a slightly elevated chance of error.

LLR Combine Module

The LLR combine module 411 is configured to combine bit LLRs corresponding to a common OFDM Symbol index from different antennas 401A and 401B. The bit LLR sequence from each antenna can arrive asynchronously. For example, 1. the bit LLRs from antenna 401B may arrive after the bit LLRs from antenna 401A
2. the bit LLRs may arrive at different rates from each of the antennas.

Figure 5:
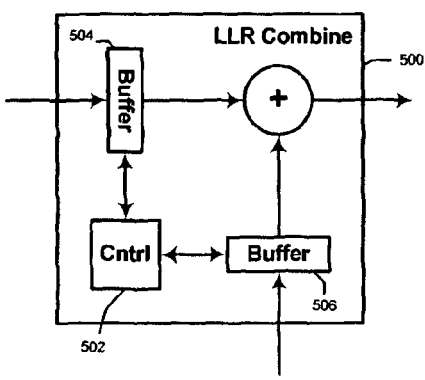
FIG. 5 is a schematic diagram of an LLR combine module for use in the arrangement of FIG. 4.

One example of the LLR combine module 500 has a controller 502 and buffers 504 and 506 for each antenna to be combined as illustrated in FIG. 5. The use of buffers 504 and 506 allows for more than two antennas. Each antenna may correspond to a buffer for holding a small number of OFDM symbols worth of LLRs. The bit LLRs from an antenna are marked as a group with the OFDM symbol of the packet being processed.

The controller 502 waits until one of the following conditions is satisfied before causing the buffers to release and pass the buffered LLRs to the FEC decoder 412:

Condition 1: All bit LLRs for a particular OFDM symbol are present in the buffers (504 and 506).

Condition 2: Too much time has passed since waiting began for the other antennas to deliver corresponding bit LLRs.

Condition 3: Too many bit LLRs have arrived from Symbols with later indices.

Waiting begins when any buffer reaches a full quota of bit LLRs for a new OFDM Symbol.

These conditions provide robustness to failure of antenna modules or their inter-connections.

The buffers 504 and 506 may perform individual (per bit) LLR additions for corresponding symbol LLRs prior to release to the FEC decoder 412 in order to reduce system latency. These additions could be discarded if Condition 2 or 3 occurs.

The OFDM symbol clock is critical in OFDM receiver design. This is because the IFFT/FFT and interleaver/deinterleaver are based on OFDM symbol sized blocks. Although there are typically a fixed number of subcarriers per OFDM symbol the number of coded bits varies based on the modulation mode. The number of bits carried per OFDM symbol can vary from OFDM symbol to OFDM symbol within the packet.

Let the number of coded bits modulating the sub-carriers be N[i] in OFDM Symbol i. For example in IEEE 802.11p, for code rate 1/2 QPSK, N[i] is 96. Let the value of the LLR produced by antenna module k corresponding to bit j in OFDM symbol i be $\lambda \cdot [i,j,k]$. The LLR Combine module attempts to compute $\lambda[i,j]$ being the log likelihood ratio for bit j in OFDM Symbol i. In one embodiment $\lambda[i,j]$ is computed as the sum of each of the LLRs corresponding to the same bit and OFDM symbol from all antenna modules.

$$\lambda[i, j] = \sum_k \lambda[i, j, k]$$

Figure 6:
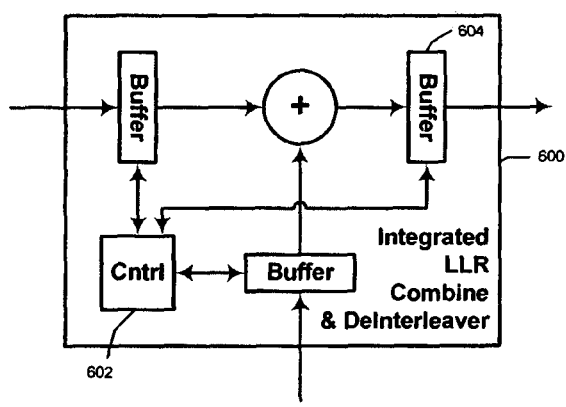
FIG. 6 is a schematic diagram of an integrated de-interleaver and LLR combine module for use in the arrangement of FIG. 4.

As each bit LLR is constructed from its constituent parts from the antenna modules the deinterleaving function may also be incorporated into the addressing of the result storage. In FIG. 6 we show the structure 600 whereby the controller 602 manages the synchronisation of the antenna module contributions and mapping of resultant combined bit LLRs into the output buffer 604. The bit LLRs as arranged by the controller, are now in deinterleaved order ready to be fed into the FEC Decoder. In this integrated LLR Combine case there is no need for the FEC Decoder module to have any internal deinterleaver capability.

Channel Estimate module

The channel estimate module (408A and 408B) is robust to asynchronism between the symbol index for which it must produce a channel estimate synchronously even if the training symbols from the FEC decoder 412 and received symbols from FFT modules 406A and 406B are provided asynchronously.

The channel estimate module (408A and 408B) has the ability to estimate the frequency domain channel for OFDM symbol i given only previous OFDM symbol FFT outputs and previous OFDM symbol training symbols. The training symbols are typically delayed because of delay in the FEC decoder. In particular a Viterbi decoder may introduce at least one OFDM symbol-worth of delay in order to release bits (either information or coded) of good quality (i.e. low Bit Error rate).

Another difficulty that is accommodated by the channel estimate module (408A and 408B) is that the delay, measured in OFDM symbols, introduced by the FEC decoder 412 may vary depending on a number of factors such as signal to noise ratio (SNR) and data rate. The FEC decoder 412 may be able to release high quality data with less delay if the SNR is high or the number of information bits per OFDM symbol is high. For example, in IEEE 802.11p the number of information bits (trellis epochs) per OFDM symbol is between 24 and 216. While 216 of traceback before release from the Viterbi decoder is enough to provide high quality release bits, 24 is not. Therefore the variation in delay from the FEC decoder measured in OFDM symbol heartbeats varies depending on the data rate of the packet.

To address this delay variation the channel estimate module may store recently received or "aging" OFDM symbols. For example, in cases where the delay in feedback is high, the channel estimate modules may provide a channel estimate based on a received OFDM symbol that is three or four OFDM symbol periods older than the currently received OFDM symbol.

With increasing delay, the correlation of the channel estimate derived from these aging OFDM symbols with the symbol to next be demodulated is reducing. This reduced correlation can reduce the maximum vehicle velocities that can be supported. Delay can be reduced by configuring the FEC decoder 412 to send training symbols from younger OFDM symbols resulting from the decoding process. These training symbols may be of lower quality than training symbols obtained from the release grade bits (i.e. bits corresponding to the information bearing symbol) but can be of sufficient quality for channel estimation.

For example, when decoding BPSK in IEEE 802.11p, OFDM Symbol i Bit LLRs update the FEC Decoder state. A subsequent traceback phase can then release training symbols for OFDM symbol i−1 to the remote unit for channel estimation and OFDM symbol i−2 for release as information bearing bits or symbol to the upper layer of the communication protocol such as the Medium Access Control layer. In addition, the dual release Viterbi decoder would advantageously release coded bits for OFDM symbol i−1 and information bits for OFDM symbol i−2.

The asynchronous nature of the channel estimate module means that priority can be given to the bit LLR transport across the link 414 between antenna modules 400A and 400B with training symbols being transported with lower priority or additional latency to the remote channel estimate module.

IEEE 802.11p may require that an Acknowledgement packet be transmitted a few microseconds after the packet completes its arrival if it were successfully received. This means that delay in decoding a packet must be minimised and is another reason to prioritise the bit LLR transport over the training symbol transport across the link.

Acquisition will also use the serial interface 414 to provide joint antenna acquisition prior to the OFDM symbol demodulation phase of packet reception.

Dual Radios

Figure 7:
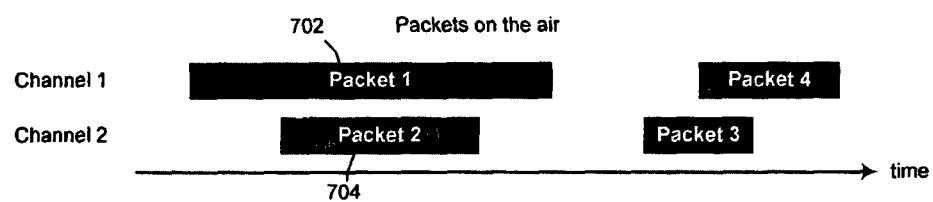
FIG. 7 illustrates an example in which packets arrive simultaneously over two channels.

When two (or more) antenna modules are present it is possible to support two (or more) parallel radio functions. Such a system is capable of FEC decoding two independent packets in parallel that arrive asynchronously, but overlapped, on the air as illustrated in FIG. 7. Moreover, the reception of each packet can benefit from the full antenna diversity available in the system. This can be achieved by having dual channel RF devices that can mix down two different frequencies.

Figure 8:
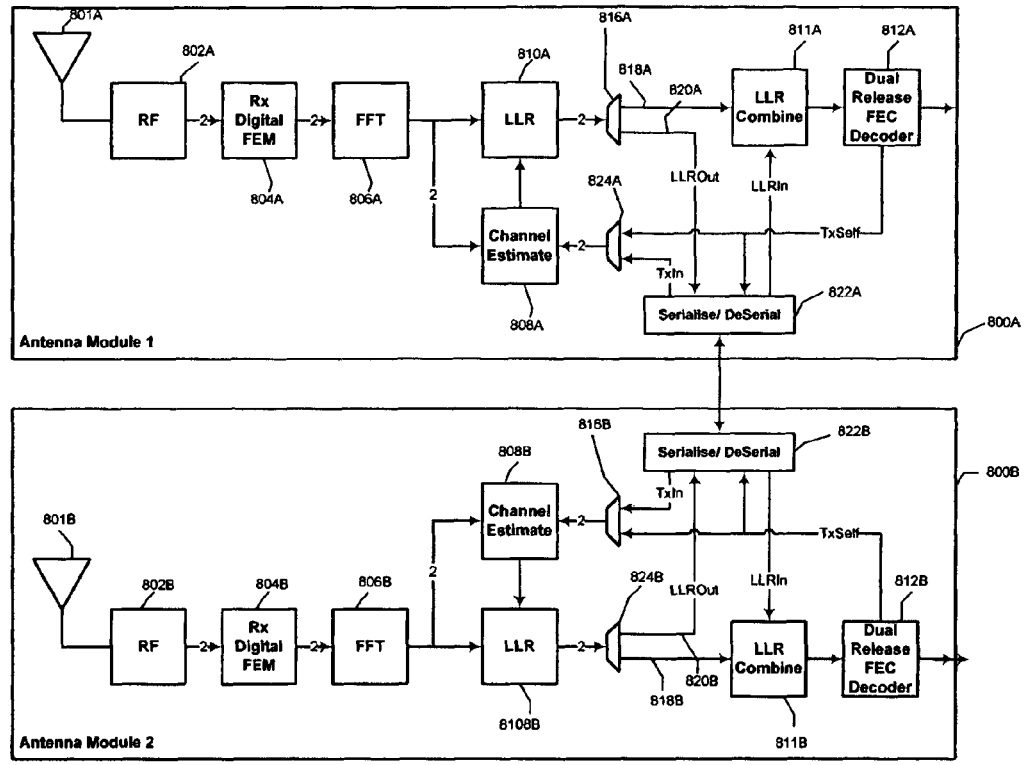
FIG. 8 is a schematic diagram of a serial implementation of a dual radio architecture.

A symmetric system with identical functionality in each antenna module (800A and 800B) is shown in FIG. 8. The hardware and software in each module is identical, thus only one type of module needs to be manufactured. There is no longer a concept of master and slave in this dual radio architecture. The two modules are peers.

The symmetric system may be suitable for use in receiving two simultaneous packet streams (e.g. 702 and 704) on the air occupying two different channels. Typically these simultaneous packet streams would use different frequencies such as Service Channels (SCH) and Control Channel (CCH) contemplated in IEEE 1609.4.

The signal processing module within each of antenna modules 800A and 800B (i.e. the antenna module less the antenna) is capable of processing these multiple streams. This can be achieved by duplicating hardware and software modules or by serialisation of the processing (or a combination).

In the symmetric system illustrated in FIG. 8, each antenna module (800A and 800B) includes an antenna (801A and 801B), a RF module (802A and 802B), a FEM (804A and 804B), a FFT module (806A and 806B) and a channel estimate (808A and 808B). Similar to the antenna modules in FIG. 4, each RF module (802A and 802B) frequency-down-converts the signal containing the two channels received by the corresponding antenna (801A and 801B) for subsequent provision to the respective FEM (804A and 804B). Each FEM may perform functions such as analogue to digital conversion (ADC), filtering, Automatic Gain control and synchronisation (time and frequency). The output of each FEM (804A and 804B) is then provided to the respective FFT module (806A and 806B) for transforming a time domain signal containing the two channels into frequency domain. Each antenna module (800A and 800B) may include its respective LLR module (810A and 810B) for generating a joint stream of bit LLR sequences corresponding to the two channels based on the frequency domain signal provided by the corresponding FFT module (806A and 806B). Each generated sequence of bit LLRs in the joint stream corresponds to the information-bearing symbol carried in a particular channel of the transmitted signal. In the symmetric system illustrated in FIG. 8, both antenna modules 800A and 800B include a LLR combine module (811A and 811B) for combining the bit LLR sequences and a dual release FEC decoder (812A and 812B).

A likely implementation of the dual path front end would have a dual channel radio frequency integrated circuit (RFIC) in the RF modules 802A and 802B capable of tuning to two separate frequencies. Alternatively two independently controlled RFICs could be used. The two baseband streams from the RFICs (corresponding to the two channels) then are fed to the Rx Digital front end where a set of ADCs for each channel are provided. Once digitised the samples are interleaved to allow for serial processing of the two contexts. This interleaving may be at the sample level or by groups of samples (perhaps corresponding to the number of samples in an OFDM Symbol). The connections between processing blocks annotated with a 2 in FIG. 8 carry signals corresponding to both channels at the same time.

The demultiplexer 816A and 816B splits the joint stream into individual bit LLR streams (e.g. 818A and 820A, and 818B and 820B) corresponding to each particular channel. The stream that the collocated FEC decoder (i.e. 818A and 818B) is to decode is sent to the LLR combine module (811A and 811B). The stream corresponding to the other channel (i.e. 820A and 820B) is sent out to the link interface module (822A and 822B) for sending to the other module. Each LLR combine module (811A and 811B) is configured to receive and combine bit LLR sequences corresponding to the same channel for provision to the corresponding FEC decoder (812A and 812B).

Each multiplexer (824A and 824B) accepts training symbols fed back from its own dual release FEC decoder and from the other dual release FEC decoder in the other module. These training symbols are multiplexed together in a manner consistent with the multiplexing of the frontend. Each channel estimate module (808A and 808B) provides a channel estimate to the corresponding LLR module (810A and 810B) based on the frequency domain signal containing the two channels and/or the multiplexed training symbols.

Figure 9:
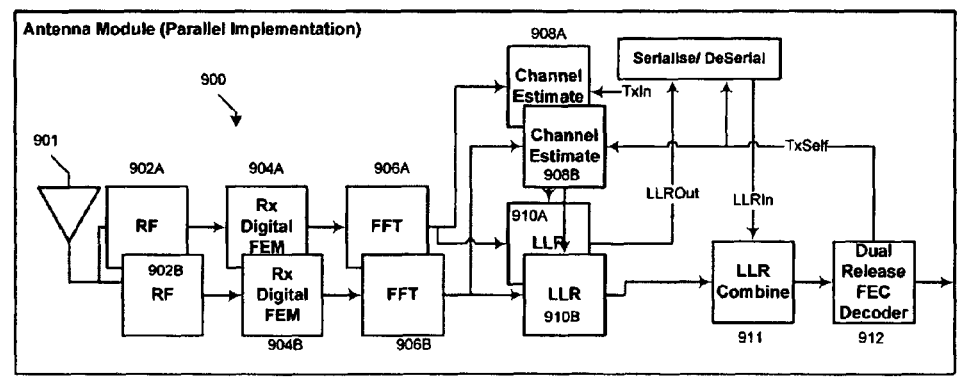
FIG. 9 is a schematic diagram of a parallel implementation of a dual radio architecture.

In the case of a complete parallel implementation, instead of multiplexing the channels the architecture 900 in FIG. 9 may be used. For simplification, FIG. 9 only illustrates one antenna module without illustrating an identical antenna module to achieve two-antenna diversity gain. Here the RF modules (902A and 902B), FEMs (904A, 904B), FFT modules (906A, 906B), channel estimate modules (908A, 908B) and LLR modules (910A and 910B) are duplicated and provided in parallel for each channel. In the architecture illustrated in FIG. 9, a single antenna 901 receives a transmitted multi-channel signal and provides the received signal to both RF modules 902A and 902B. The RF modules 902A and 902B frequency-down-convert the received signal for subsequent provision to the respective FEM (904A and 904B). Each FEM may perform functions such as analogue to, digital conversion (ADC), filtering, Automatic Gain control and synchronisation (time and frequency). The output of each FEM (904A and 904B) is then provided to the respective FFT module (906A and 906B) for providing a fast Fourier transform signal to the respective LLR module (910A and 910B). Each LLR module (906A and 906B) generates LLR sequences corresponding to a particular channel based on the fast Fourier transformed signal provided by the corresponding FFT module (806A and 806B). Each generated sequence of LLRs corresponds to the information-bearing symbol carried in a particular channel of the transmitted signal. The LLRs are combined and provided to the dual release FEC decoder 912.

Compared to the serial implementation in FIG. 8, the parallel implementation requires the FEM, the FFT modules, the channel estimate modules and the LLR modules to operate at half the processing speed at the expense of higher component counts. Functionally the result of processing is substantially identical in the two cases. The serial link interfaces, the LLR combine the modules and the dual release FEC decoders are identical in each implementation.

The functional modules described herein and schematically illustrated in FIGS. 4, 5, 6, 8 and 9 may be implemented in hardware, for example application-specific integrated circuits (ASICs). Other hardware implementations include, but are not limited to, field-programmable gate arrays (FPGAs), structured ASICs, digital signal processors and discrete logic. Alternatively, the functional modules may be implemented as software, such as one or more application programs executable within a computer system. The software may be stored in a computer-readable medium and be loaded into a computer system from the computer-readable medium for execution by the computer system. A computer readable medium having a computer program recorded on it is a computer program product. Examples of such media include, but are not limited to CD-ROMs, hard disk drives, a ROM or integrated circuit. Program code may also be transmitted via computer-readable transmission media, for example a radio transmission channel or a networked connection to another computer or networked device.

It will be understood that the invention disclosed and defined in this specification extends to all alternative combinations of two or more of the individual features mentioned or evident from the text or drawings. All of these different combinations constitute various alternative aspects of the invention.

The claims are as follows:

1. A split signal processing system comprising:
   multiple antennas for receiving transmitted signals carrying an information-bearing symbol, the information bearing symbol being part of a transmission of coded bits;
   multiple signal processing modules associated with the respective antennas and generating respective bit log-likelihood ratio (LLR) sequences based in part on a channel estimate from a channel estimator, each bit LLR sequence corresponding to the information-bearing symbol;
   at least one of the signal processing modules comprising a LLR combiner for combining the bit LLR sequences; and
   at least one of the signal processing modules comprising a forward error correction (FEC) decoder for decoding the combined bit LLR sequences and releasing an information sequence and an estimate of the coded bits;
   wherein the channel estimator of at least one of the signal processing modules forms a channel estimate based on the estimate of the coded bits from another of the signal processing modules.

2. The system of claim 1 wherein the multiple signal processing modules includes a master signal processing module and one or more associated slave signal processing modules.

3. The system of claim 2, wherein the FEC decoder is part of the master signal processing module and the channel estimate is formed by a channel estimator of a slave signal processing module.

4. The system of claim 2 wherein the one or more associated slave modules are configured to send the respective bit LLR sequences to the master module asynchronously.

5. The system of claim 2 wherein the associated slave modules are configured with high priority access to respective links between the master module and the one or more associated slave modules for sending bit LLR sequences.

6. The system of claim 5 wherein the one or more associated slave modules are configured to receive training symbol identifiers based on the estimate of the coded bits from the master module upon availability of the respective links.

7. The system of claim 1 wherein each signal processing module comprises a channel estimator.

8. The system of claim 6, wherein the channel estimator in a slave module is configured to produce synchronous channel estimates while the training symbol identifiers are available asynchronously.

9. The system of claim 1 wherein the LLR combiner includes a de-interleaver.

10. The system of claim 1 wherein the transmitted signals include signals transmitted across multiple channels.

11. The system of claim 10 wherein the multiple signal processing modules includes two or more signal processing modules configured as peer modules each associated with a respective channel.

12. The system of claim 11 wherein the peer modules each include multiplexers and demultiplexers for serial processing of the multiple channels.

13. The system of claim 11 wherein the peer modules each include multiple processing streams for parallel processing of the multiple channels.

14. The system of claim 1 wherein the multiple antennas are mounted on a vehicle.

15. The system of claim 14 wherein the multiple antennas are spaced apart from one another on the vehicle.

16. The system of claim 1 wherein the signal processing modules are located near their respective associated antennas.

17. A signal processing module for use in a split signal processing system including multiple antennas for receiving transmitted signals carrying an information-bearing symbol, the information bearing symbol being part of a transmission of coded bits, the signal processing module being associated with one of the multiple antennas and comprising:

a data generator for generating a first bit log-likelihood ratio (LLR) sequence corresponding to the information-bearing symbol;

a LLR combiner for combining the first bit LLR sequence with one or more second bit LLR sequences corresponding to the information-bearing symbol; and a forward error correction (FEC) decoder for decoding the combined bit LLR sequences and releasing an information sequence and releasing, to another signal processing module associated with another one of the multiple antennas, an estimate of the coded bits.

18. The signal processing module of claim 17 configured as a master module associated with one or more slave modules.

19. The signal processing module of claim 17 wherein the transmitted signals include signals transmitted across multiple channels and the signal processing module modules further comprising multiplexers and demultiplexers for serial processing of the multiple channels.

20. The signal processing module of claim 17 wherein the transmitted signals include signals transmitted across multiple channels and the signal processing module modules further comprises multiple processing streams for parallel processing of the multiple channels.

\* \* \* \* \*